(12) United States Patent
Abe et al.

(10) Patent No.: US 6,429,486 B1
(45) Date of Patent: Aug. 6, 2002

(54) SEMICONDUCTOR SUPPORT SUBSTRATE POTENTIAL FIXING STRUCTURE FOR SOI SEMICONDUCTOR DEVICE

(75) Inventors: Katsumi Abe; Kazuhisa Mori, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/444,374

(22) Filed: Nov. 22, 1999

(30) Foreign Application Priority Data

Nov. 20, 1998 (JP) .......................................... 10-330301

(51) Int. Cl.$^7$ ........................... H01L 27/01; H01L 29/00
(52) U.S. Cl. ...................... 257/354; 257/349; 257/353; 257/507; 257/508; 257/520
(58) Field of Search .................................. 257/347, 349, 257/352, 353, 354, 507, 508, 510, 520

(56) References Cited

U.S. PATENT DOCUMENTS

| | | | | |
|---|---|---|---|---|
| 5,945,712 A | * | 8/1999 | Kim | 257/349 |
| 6,133,610 A | * | 10/2000 | Bolam et al. | 257/349 |

FOREIGN PATENT DOCUMENTS

| | | |
|---|---|---|
| JP | 3-272142 | 12/1991 |
| JP | 4-280456 | 10/1992 |
| JP | 4-343265 | 11/1992 |
| JP | 5-29603 | 2/1993 |
| JP | 5-144930 | 6/1993 |
| JP | 9-283640 | 10/1997 |
| JP | 11-354631 | 12/1999 |

\* cited by examiner

*Primary Examiner*—Minh Loan Tran
(74) *Attorney, Agent, or Firm*—Sughrue Mion, PLLC

(57) ABSTRACT

A semiconductor device of a SOI (silicon on insulator) structure includes a P-type silicon support substrate, a first insulating layer formed on the semiconductor support substrate, and an SOI layer formed on the first insulating layer. A first hole is formed to penetrate through the semiconductor layer and the first insulating layer, and a P-type polysilicon layer is filled in the first hole so that the P-type polysilicon layer is electrically connected to the semiconductor support substrate. A second insulating layer is formed on the SOI layer. A second hole is formed to penetrate through the second insulating layer in alignment with the first hole, and an aluminum electrode is formed on the second insulating layer to fill the second hole, so that the aluminum electrode is electrically connected through the P-type polysilicon layer to the silicon support substrate. Thus, the potential of the silicon support substrate can be fixed through the aluminum electrode formed on the SOI layer side.

12 Claims, 2 Drawing Sheets

SEMICONDUCTOR SUPPORT SUBSTRATE POTENTIAL FIXING STRUCTURE FOR SOI SEMICONDUCTOR DEVICE

BACKGROUND OF THE INVENTION

The present invention relates to a semiconductor device, and more specifically to a semiconductor support substrate potential fixing structure for a SOI (silicon on insulator) semiconductor device and a process for forming the same.

In general, a semiconductor device having a SOI (silicon on insulator) structure comprises a layered structure composed of a semiconductor layer used for forming semiconductor circuit components (such as transistors), a semiconductor support substrate for supporting the semiconductor layer, and an insulating layer provided between the semiconductor layer and the semiconductor support substrate. The semiconductor device having the SOI structure is used either by putting the semiconductor support substrate in an electrically opened condition, or by forming an electrode on a back surface of the semiconductor support substrate and fixing a potential of the back surface electrode. When the potential of the back surface electrode is not fixed, the potential of the semiconductor support substrate varies because of an input signal and others, with the result that the semiconductor circuit components (such as transistors) are influenced through the insulating layer and resultantly cause a malfunction.

The fixing of the potential of the semiconductor support substrate is disclosed by Japanese Patent Application Pre-examination Publication No. JP-A-05-144930 (an English abstract of JP-A-05-144930 is available from the Japanese Patent Office and the content of the English abstract of JP-A-05-144930 is incorporated by reference in its entirety into this application) and Japanese Patent Application Pre-examination Publication from the Japanese Patent Office and the content of the English abstract of JP-A-09-283640 is incorporated by reference in its entirety into this application).

However, in a package such as a tape carrier package in which the back surface electrode of the semiconductor support substrate cannot be connected to an external terminal, it is impossible to mount on a tap carrier the semiconductor device having the back surface electrode for fixing the potential of the semiconductor support substrate.

BRIEF SUMMARY OF THE INVENTION

Accordingly, it is an object of the present invention to provide an SOI type semiconductor device and a process for forming the same, which has overcome the above mentioned problem of the prior art.

Another object of the present invention is to provide an SOI type semiconductor device, capable of fixing the potential of the semiconductor support substrate to prevent the malfunction of the semiconductor circuit components (such as transistors), in a package so configured that a back surface electrode cannot be connected to an external terminal, and a process for forming the same.

The above and other objects of the present invention are achieved in accordance with the present invention by an SOI type semiconductor device in which an electrode for fixing the potential of a semiconductor support substrate is formed at an SOI layer side where a semiconductor circuit component (such as a transistor) is formed.

According to a first aspect of the present invention, there is provided a semiconductor device of a silicon-on-insulator structure which includes a semiconductor support substrate, a first insulating layer formed on the semiconductor support substrate, and a semiconductor layer formed on the first insulating layer, the semiconductor device comprising a conductive layer filled in a first hole penetrating through the semiconductor layer and the first insulating layer, the conductive layer being electrically connected to the semiconductor support substrate, a second insulating layer formed on the semiconductor layer, and a semiconductor support substrate potential fixing electrode formed on the second insulating layer and filled into a second hole penetrating through the second insulating layer in alignment with the first hole, the semiconductor support substrate potential fixing electrode being electrically connected through the conductive layer to the semiconductor support substrate.

In an embodiment of the semiconductor device, the semiconductor layer is divided by a device isolation region into a plurality of device formation regions which are electrically isolated from each other by the device isolation region, and the first hole is formed to penetrate through the semiconductor layer within one of the plurality of device formation regions and the first insulating layer, and the conductive layer being electrically connected to the semiconductor layer within the one of the plurality of device formation regions.

In another embodiment of the semiconductor device, the semiconductor layer is divided by a device isolation region into a plurality of device formation regions which are electrically isolated from each other by the device isolation region, the device isolation region extending at least from a top surface to a bottom surface of the semiconductor layer, and the first hole is formed in the device isolation region to reach the semiconductor support substrate.

Specifically, the device isolation region is formed of an insulating material, and the first hole. is formed in the device isolation region in such a manner that the conductive layer filled in the first hole is electrically insulated from the semiconductor layer by the insulating material remaining on a side wall of the first hole. A side surface of the first hole is surrounded by an insulator layer extending at least from the top surface of the semiconductor layer to a top surface of the semiconductor support substrate.

For example, the conductive layer filled in the first hole is formed of a polycrystalline semiconductor having the same conductivity as that of the semiconductor support substrate.

According to a second aspect of the present invention, there is provided a method for forming a semiconductor device of a silicon-on-insulator structure which includes a semiconductor support substrate, a first insulating layer formed on the semiconductor support substrate, and a semiconductor layer formed on the first insulating layer, the method comprising the steps of:

forming a first hole and a groove penetrating through the semiconductor layer and the first insulating layer to reach the semiconductor support substrate, so that the semiconductor layer is divided by the groove into a plurality of device formation regions which are electrically isolated from each other by the groove;

filling a second insulating layer into the groove;

filling a conductive material into the first hole so that the conductive material filled into the first hole is electrically connected to the semiconductor support substrate at a bottom of the first hole;

forming a third insulating layer to cover the semiconductor layer;

forming a second hole to penetrate through the third insulating layer in alignment with the first hole and to reach the conductive material filled into the first hole; and forming a semiconductor support substrate potential fixing electrode on the third insulating layer to fill the second hole so that the semiconductor support substrate potential fixing electrode is electrically connected to the semiconductor support substrate through the conductive material filled into the first hole.

According to a second aspect of the present invention, there is provided a method for forming a semiconductor device of a silicon-on-insulator structure which includes a semiconductor support substrate, a first insulating layer formed on the semiconductor support substrate, and a semiconductor layer formed on the first insulating layer, the method comprising the steps of:

forming a groove penetrating through the semiconductor layer and the first insulating layer to reach the semiconductor support substrate, so that the semiconductor layer is divided by the groove into a plurality of device formation regions which are electrically isolated from each other by the groove;

forming a second insulating layer to cover a bottom surface and a side surface of the groove;

selectively removing the second insulating layer to expose the semiconductor support substrate at a bottom of the groove, while leaving the second insulating layer covering the side surface of the groove;

filling a conductive material into the groove so that the conductive material filled into the groove is electrically connected to the semiconductor support substrate at a bottom of the groove;

forming a third insulating layer to cover the semiconductor layer;

forming a hole to penetrate through the third insulating layer in alignment with the conductive material filled into the groove and to reach the conductive material filled into the groove; and forming a semiconductor support substrate potential fixing electrode on the third insulating layer to fill the hole so that the semiconductor support substrate potential fixing electrode is electrically connected to the semiconductor support substrate through the conductive material filled into the groove.

For example, the conductive material is formed of a polycrystalline semiconductor having the same conductivity as that of the semiconductor support substrate.

Preferably, after the conductive material is filled in the first hole, a rapid thermal annealing is carried out at a temperature of not less than 1050 degrees Celsius.

The above and other objects, features and advantages of the present invention will be apparent from the following description of preferred embodiments of the invention with reference to the accompanying drawings.

DETAILED DESCRIPTION OF THE INVENTION

Figure 1:
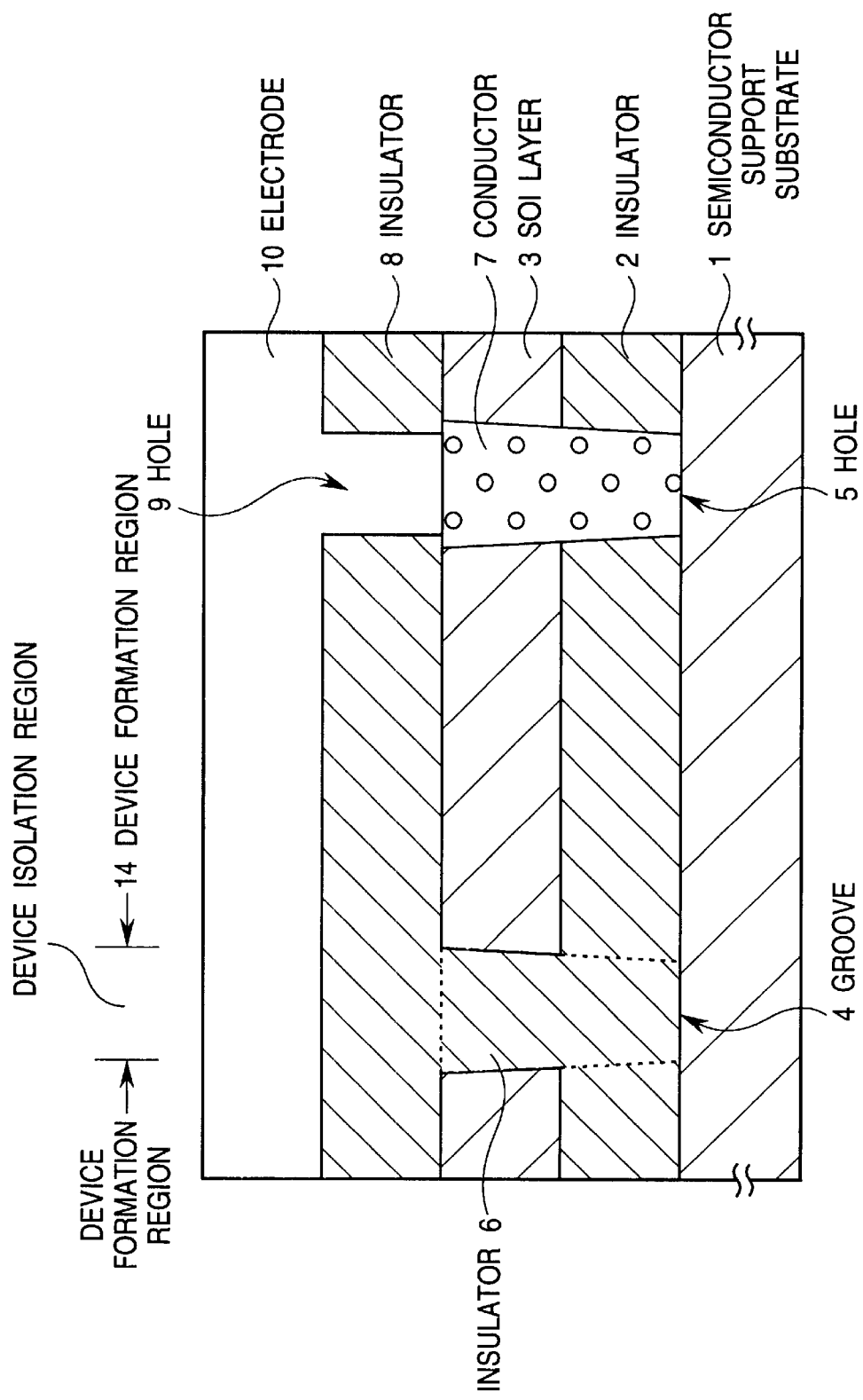
FIG. 1 is a diagrammatic partial sectional view of a first embodiment of the SOI type semiconductor device in accordance with the present invention.

Referring to FIG. 1, there is shown a diagrammatic partial sectional view of a first embodiment of the SOI type semiconductor device in accordance with the present invention.

As shown in FIG. 1, a first insulating layer 2, which is formed of for example a silicon oxide, is deposited on a semiconductor support substrate 1 which is formed of for example a P-type silicon substrate. An SOI layer 3, which is formed of for example a P-type silicon layer, is deposited on the first insulating layer 2.

A groove 4 is formed to penetrate through the SOI layer 3 and the first insulating layer 2 to reach an upper surface of the semiconductor support substrate 1, so that the SOI layer 3 is divided by the groove into a plurality of device formation regions which are electrically isolated from each other by the groove 4. In the SOI layer 3 within each of the device formation regions, at least one semiconductor circuit component (not shown), typified by a transistor, is formed. A second insulating layer 6, which is formed of for example a silicon oxide, is filled into the groove 4 to cover a side surface and a bottom surface of the groove 4. Thus, a device isolation region is formed.

Furthermore, a first hole 5 is formed to penetrate through the SOI layer 3 within one device formation region 14 and through the first insulating layer 2, to reach the upper surface of the semiconductor support substrate 1 within the device formation region 14. A conductive material, which is for example a P-type polysilicon having a high impurity concentration, is filled into the first hole 5, so that a conductive pillar 7 formed in the first hole 5 is electrically connected to the semiconductor support substrate 1 at a bottom of the first hole 5.

In the above mentioned process, the groove 4 and the first hole 5 are sequentially formed, but can be simultaneously formed, and thereafter, are separately filled up with the second insulating layer 6 and the conductive pillar 7, respectively.

Then, a third insulating layer 8, which is formed of for example a silicon oxide, is deposited to cover the SOI layer 3, and a second hole 9 is formed to penetrate through the third insulating layer 8, in alignment with the first hole 5 and to reach a top of the conductive pillar 7 formed in the first hole 5.

Furthermore, an aluminum electrode 10 is formed on the third insulating layer 8 to fill the second hole 9 so that the alumninum electrode 10 is electrically connected to the semiconductor support substrate 1 through the conductive pillar 7 formed in the first hole 5. The aluminum electrode 10 is also used as a wiring conductor.

Thus, the potential of the semiconductor support substrate 1 can be fixed by use of the electrode 10 provided at an SOI layer side where a semiconductor circuit component (such as a transistor) is formed.

In this embodiment, since the conductive pillar 7 is connected to the SOI layer 3 within the device formation region 14, the semiconductor circuit component (typified by a transistor) is not formed in the SOI layer 3 within the device formation region 14. However, the semiconductor circuit component can be formed in the SOI layer 3 within the device formation region 14, if no problem is caused by the fact that the conductive pillar 7 is connected to the SOI layer 3 within the device formation region 14.

Figure 2:
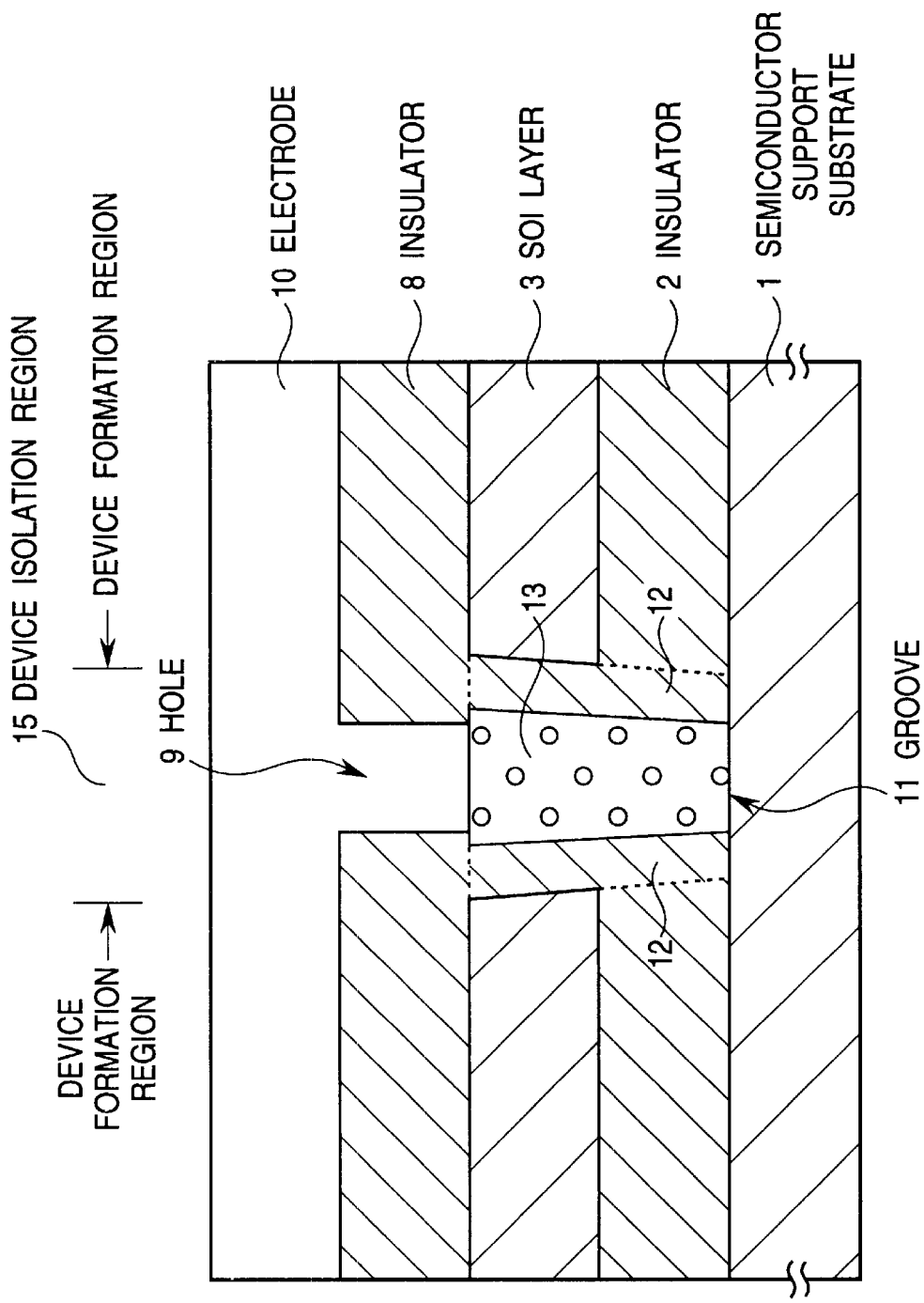
FIG. 2 is a diagrammatic partial sectional view of a second embodiment of the SOI type semiconductor device in accordance with the present invention.

Referring to FIG. 2, there is shown a diagrammatic partial sectional view of a second embodiment of the SOI type semiconductor device in accordance with the present invention.

As shown in FIG. 2, and similarly to the first embodiment, a first insulating layer 2, which is formed of for example a silicon oxide, is deposited on a semiconductor support substrate 1, which is formed of for example a P-type silicon substrate. An SOI layer 3, which is formed of for example a P-type silicon layer, is deposited on the first insulating layer 2.

A groove 11 is formed to penetrate through the SOI layer 3 and the first insulating layer 2, so that the SOI layer 3 is divided by the groove 11 into a plurality of device formation regions which are electrically isolated from each other by the groove 11. Then, a second insulating layer 12, which is formed of for example a silicon oxide, is deposited to cover a bottom surface and a side surface of the groove 11, and the second insulating layer 12 deposited on the bottom surface of the groove 11 is selectively removed to expose the semiconductor support substrate at a bottom of the groove 11, while leaving the second insulating layer covering the side surface of the groove 11.

Succeedingly, a conductive material, which is for example a P-type polysilicon having a high impurity concentration, is filled into the groove 11 so that a conductive wall-like member 13 formed in the groove 11 is electrically connected to the semiconductor support substrate 1 at the bottom of the groove 11 but is electrically isolated from the SOI layer 3 by the remaining second insulating layer 12 covering the side surface of the groove 11.

A third insulating layer 8, which is formed of for example a silicon oxide, is deposited to cover the SOI layer 3, and a hole 9 is formed to penetrate through the third insulating layer 8, in alignment with the conductive wall-like member 13 formed in the groove 11 and to reach a top of the conductive wall-like member 13 formed in the groove 11.

Furthermore, an aluminum electrode 10 is formed on the third insulating layer 8 to fill the hole 9 so that the aluminum electrode 10 is electrically connected to the semiconductor support substrate 1 through the conductive wall-like member 13 formed in the groove 11. The aluminum electrode 10 is also used as a wiring conductor.

In the second embodiment, the groove 11 functions as the device isolation for dividing the SOI layer 3 into a plurality of device formation regions, and simultaneously, the groove 11 is used for electrically connect between the electrode 10 and the semiconductor support substrate 1.

Thus, the potential of the semiconductor support substrate 1 can be fixed by use of the electrode 10 provided at an SOI layer side where a semiconductor circuit component (such as a transistor) is formed. In addition, since the device isolation and the semiconductor support substrate potential fixing conductive pillar are formed in the same groove, the device area can be effectively utilized.

In the first and second embodiments, when the conductive member 7 or 13 is formed by filling the P-type polysilicon into the hole 5 or the groove 11, there is possibility that a natural oxide film is formed between the semiconductor support substrate 1 of the P-type silicon and the conductive member 7 or 13 of the P-type polysilicon, with the result that a resistance component between the electrode 10 and the semiconductor support substrate 1 is relatively large. In order to overcome this problem, after the conductive member 7 or 13 is formed by filling the P-type polysilicon into the hole 5 or the groove 11, a heat treatment is preferably carried out by means of a rapid thermal annealing at a temperature of not less than 1050 degrees Celsius, so that the natural oxide film is broken and the resistance component between the electrode 10 and the semiconductor support substrate 1 can be reduced.

As mentioned above, according to the present invention, the electrode for fixing the potential of the semiconductor support substrate is formed at the SOI layer side where semiconductor circuit components are formed.

Thus, when the semiconductor device is mounted on a package such as a tape carrier package in which the back surface electrode of the semiconductor support substrate cannot be connected to an external terminal, it is possible to fix the potential of the semiconductor support substrate to prevent the malfunction of the semiconductor circuit components (such as transistors).

The invention has thus been shown and described with reference to the specific embodiments. However, it should be noted that the present invention is in no way limited to the details of the illustrated structures but changes and modifications may be made within the scope of the appended claims.

What is claimed is:

1. A semiconductor device of a silicon-on-insulator structure which includes a semiconductor support substrate, a first insulating layer formed on said semiconductor support substrate, and a semiconductor layer formed on said first insulating layer, the semiconductor device comprising a conductive layer filled in a first hole penetrating through said semiconductor layer and said first insulating layer, said conductive layer being electrically connected to said semiconductor support substrate, a second insulating layer formed on said semiconductor layer, and a semiconductor support substrate potential fixing electrode formed on said second insulating layer and filled into a second hole penetrating through said second insulating layer in alignment with said first hole so that the portion of said semiconductor support substrate potential fixing electrode that is filled in said second hole extends only through said second insulating layer, said semiconductor support substrate potential fixing electrode being electrically connected through said conductive layer to said semiconductor support substrate.

2. A semiconductor device claimed in claim 1 wherein said semiconductor layer is divided by a device isolation region into a plurality of device formation regions which are electrically isolated from each other by said device isolation region, and said first hole is formed to penetrate through said semiconductor layer within one of said plurality of device formation regions and said first insulating layer, and said conductive layer being electrically connected to said semiconductor layer within said one of said plurality of device formation regions.

3. A semiconductor device claimed in claim 2 wherein said conductive layer filled in said first hole is formed of a polycrystalline semiconductor having the same conductivity as that of said semiconductor support substrate.

4. A semiconductor device claimed in claim 1 wherein said semiconductor layer is divided by a device isolation region into a plurality of device formation regions which are electrically isolated from each other by said device isolation region, said device isolation region extending at least from a top surface to a bottom surface of said semiconductor layer, and said first hole is formed in said device isolation region to reach said semiconductor support substrate.

5. A semiconductor device claimed in claim 4 wherein said conductive layer filled in said first hole is formed of a polycrystalline semiconductor having the same conductivity as that of said semiconductor support substrate.

6. A semiconductor device claimed in claim 4 wherein said device isolation region is formed of an insulating material, and said first hole is formed in said device isolation region in such a manner that said conductive layer filled in said first hole is electrically insulated from said semiconductor layer by said insulating material remaining on a side wall of said first hole.

7. A semiconductor device claimed in claim 6 wherein said conductive layer filled in said first hole is formed of a polycrystalline semiconductor having the same conductivity as that of said semiconductor support substrate.

8. A semiconductor device claimed in claim 4 wherein a side surface of said first hole is surrounded by an insulator layer extending at least from said top surface of said semiconductor layer to a top surface of said semiconductor support substrate.

9. A semiconductor device claimed in claim 8 wherein said conductive layer filled in said first hole is formed of a polycrystalline semiconductor having the same conductivity as that of said semiconductor support substrate.

10. A semiconductor device claimed in claim 1 wherein a side surface of said first hole is surrounded by an insulator layer extending at least from said top surface of said semiconductor layer to a top surface of said semiconductor support substrate.

11. A semiconductor device claimed in claim 1 wherein said conductive layer filled in said first hole is formed of a polycrystalline semiconductor having the same conductivity as that of said semiconductor support substrate.

12. A semiconductor device claimed in claim 1; where said first hole is larger in diameter at the top of said semiconductor layer than at the bottom; and said second hole is smaller in diameter than the top of said first hole.

* * * * *